United States Patent
Lee et al.

(10) Patent No.: US 8,772,750 B2
(45) Date of Patent: Jul. 8, 2014

(54) NON-VOLATILE MEMORY ELEMENTS AND MEMORY DEVICES INCLUDING THE SAME

(75) Inventors: Chang-bum Lee, Seoul (KR); Chang-jung Kim, Yongin-si (KR); Young-bae Kim, Seoul (KR); Myoung-jae Lee, Hwaseong-si (KR); Ji-hyun Hur, Hwaseong-si (KR); Dong-soo Lee, Gunpo-si (KR); Man Chang, Seongnam-si (KR); Seung-ryul Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/115,549

(22) Filed: May 25, 2011

(65) Prior Publication Data
US 2012/0049145 A1    Mar. 1, 2012

(30) Foreign Application Priority Data

Aug. 31, 2010    (KR) .................. 10-2010-0084970

(51) Int. Cl.
*H01L 47/00*    (2006.01)
*H01L 29/06*    (2006.01)

(52) U.S. Cl.
USPC ...... 257/4; 257/5; 257/E45.003; 257/E29.002

(58) Field of Classification Search
USPC .......................... 257/E45.003, 2–5
See application file for complete search history.

(56) References Cited

U.S. PATENT DOCUMENTS

| | | | |
|---|---|---|---|
| 7,208,372 B2 | 4/2007 | Hsu et al. | |
| 2006/0160304 A1 | 7/2006 | Hsu et al. | |
| 2007/0252193 A1 | 11/2007 | Cho et al. | |
| 2008/0111245 A1* | 5/2008 | Osano et al. | 257/767 |
| 2009/0020740 A1* | 1/2009 | Chien et al. | 257/2 |
| 2009/0026434 A1 | 1/2009 | Malhotra et al. | |
| 2009/0218565 A1* | 9/2009 | Kawano et al. | 257/43 |
| 2009/0272961 A1 | 11/2009 | Miller et al. | |
| 2009/0283736 A1* | 11/2009 | Kanzawa et al. | 257/2 |
| 2009/0302296 A1 | 12/2009 | Fuchigami et al. | |
| 2010/0014344 A1* | 1/2010 | Wu et al. | 365/148 |
| 2010/0038791 A1 | 2/2010 | Lee et al. | |
| 2010/0181546 A1 | 7/2010 | Yamamoto et al. | |

FOREIGN PATENT DOCUMENTS

| | | |
|---|---|---|
| JP | 2009021524 A | 1/2009 |
| JP | 2009124167 A | 6/2009 |
| KR | 1020010059661 | 7/2001 |

(Continued)

OTHER PUBLICATIONS

Extended European Search Report dated Jan. 3, 2013, issued in European Patent Application No. 11176721.6.

(Continued)

*Primary Examiner* — William F Kraig
*Assistant Examiner* — Khaja Ahmad
(74) *Attorney, Agent, or Firm* — Harness, Dickey & Pierce, P.L.C.

(57) ABSTRACT

A non-volatile memory element includes: a memory layer disposed between a first electrode and a second electrode; and a buffer layer disposed between the memory layer and the first electrode. The memory layer includes a first material layer and a second material layer. The first material layer and the second material layer are configured to exchange ionic species to change a resistance state of the memory layer.

36 Claims, 10 Drawing Sheets

< SET OPERATION >

(56) References Cited

FOREIGN PATENT DOCUMENTS

| | | |
|---|---|---|
| KR | 100718155 B1 | 5/2007 |
| KR | 1020070106224 | 11/2007 |
| KR | 1020070107861 | 11/2007 |
| KR | 1020080050989 | 6/2008 |
| KR | 1020080096283 | 10/2008 |
| KR | 1020100004363 | 1/2010 |
| KR | 1020100011318 | 2/2010 |
| WO | WO 2008069489 | 6/2008 |
| WO | WO-2008149484 A1 | 12/2008 |
| WO | WO 2009015298 | 1/2009 |

OTHER PUBLICATIONS

Extended European Search Report dated Jan. 3, 2013, issued in European Patent Application No. 11175374.5.
U.S. Office Action issued in U.S. Appl. No. 13/204,138, dated Dec. 19, 2013.
U.S. Office Action issued in U.S. Appl. No. 13/204,138, dated May 8, 2014.

* cited by examiner

< SET OPERATION >

< RESET OPERATION >

NON-VOLATILE MEMORY ELEMENTS AND MEMORY DEVICES INCLUDING THE SAME

CROSS-REFERENCE TO RELATED APPLICATION(S)

This application claims priority under 35 U.S.C. §119 to Korean Patent Application No. 10-2010-0084970, filed on Aug. 31, 2010, in the Korean Intellectual Property Office, the entire contents of which is incorporated herein by reference.

BACKGROUND

1. Field

Example embodiments relate to non-volatile memory elements and memory devices including the same.

2. Description of the Related Art

Examples of non-volatile memory devices include resistive random access memories (RRAMs), magnetic random access memories (MRAMs), ferroelectric random access memories (FRAMs), phase-change random access memories (PRAMs), etc. RRAMs store data based on a resistance change of a material. In one example, the resistance of a resistance change material decreases when a voltage greater than or equal to a set voltage is applied thereto. This is referred to as an ON state. In addition, the resistance of the resistance-change material increases when a voltage greater than or equal to a reset voltage is applied thereto. This is referred to as an OFF state.

Generally, a conventional resistive memory device includes a storage node having a resistance-change or variable resistance layer and a switching device electrically connected to the storage node. And, the switching device controls signal access to the storage node.

SUMMARY

Example embodiments provide non-volatile memory elements having resistance change characteristics and memory devices including the same. Example embodiments also provide memory systems and electronic devices.

Additional aspects will be set forth in part in the description which follows and, in part, will be apparent from the description, or may be learned by practice of example embodiments.

At least one example embodiment provides a non-volatile memory element including: a first electrode; a second electrode spaced apart from the first electrode; a memory layer disposed between the first electrode and the second electrode; and a buffer layer disposed between the memory layer and the first electrode. The memory layer includes an oxygen supplying layer and an oxygen exchanging layer, and has a resistance change characteristic resulting from movement of ionic species between the oxygen supplying layer and the oxygen exchanging layer.

At least one other example embodiment provides a non-volatile memory element including: a memory layer disposed between a first electrode and a second electrode; and a buffer layer disposed between the memory layer and the first electrode. The memory layer includes a first material layer and a second material layer configured to exchange ionic species to change the resistance state of the memory layer. The first material layer may be an oxygen supplying layer and the second material layer may be an oxygen exchanging layer.

According to at least one other example embodiment, a memory device includes a non-volatile memory element. The non-volatile memory element includes: a memory layer disposed between a first electrode and a second electrode; and a buffer layer disposed between the memory layer and the first electrode. The memory layer includes a first material layer and a second material layer configured to exchange ionic species to change the resistance state of the memory layer. The first material layer may be an oxygen supplying layer and the second material layer may be an oxygen exchanging layer.

At least one other example embodiment provides a memory system including: at least one memory device; and a controller configured to exchange electrical signals with the at least one memory device. The memory device includes a non-volatile memory element. The non-volatile memory element includes: a memory layer disposed between a first electrode and a second electrode; and a buffer layer disposed between the memory layer and the first electrode. The memory layer includes a first material layer and a second material layer configured to exchange ionic species to change the resistance state of the memory layer. The first material layer may be an oxygen supplying layer and the second material layer may be an oxygen exchanging layer.

According to at least some example embodiments, the memory device may further include a switching element connected to the non-volatile memory element.

The oxygen supplying layer may be formed of a first metal oxide including at least one of: Ta oxide, Ti oxide, Zr oxide, yttria-stabilized zirconia (YSZ), Hf oxide, Mn oxide, and Mg oxide, and a combination thereof. In one example, the first metal oxide may include $TaO_x$, wherein x may be 0<x<2.5 or 0.5≤x≤2.0.

The oxygen exchanging layer may be formed of a second metal oxide. The second metal oxide may be from the same group as the first metal oxide. Alternatively, the second metal oxide may be from a different group than the first metal oxide. For example, the second metal oxide may include at least one of: Ta oxide, Ti oxide, Zr oxide, yttria-stabilized zirconia (YSZ), Hf oxide, Mn oxide, and Mg oxide, and a combination thereof.

According to at least some example embodiments, an oxygen concentration of the oxygen exchanging layer may be greater than an oxygen concentration of the oxygen supplying layer.

According to at least some example embodiments, an oxygen mobility of the oxygen exchanging layer may be greater than or equal to an oxygen mobility of the oxygen supplying layer.

According to at least some example embodiments, an oxygen diffusivity of the oxygen exchanging layer may be greater than or equal to an oxygen diffusivity of the oxygen supplying layer.

The oxygen exchanging layer may be a material layer of which an oxygen concentration varies gradually or in stages in a direction in which the oxygen exchanging layer is deposited. In one example, the oxygen exchanging layer may have an oxygen concentration that increases from the oxygen supplying layer toward the second electrode.

According to at least some example embodiments, the buffer layer may include: a material increasing a potential barrier between the first electrode and the memory layer and/or a material having interatomic bonding energy greater than that of the memory layer. In one example, the buffer layer may include at least one of: $AlO_x$, $SiO_x$, $SiN_x$, $ZrO_x$, and $HfO_x$, and a combination thereof.

According to at least some example embodiments, the first electrode may be formed of a base metal or a conductive oxide. For example, the first electrode may include at least one of: W, Ni, Al, Ti, Ta, TiN, TiW, TaN, IZO, ITO, $IrO_2$, Ir, Ru, Pd, Au, and Pt. The second electrode may include at least one of: $IrO_2$, Ir, Ru, Pd, Au, and Pt. For example, the second electrode may be formed of $IrO_2$ or Ir.

According to at least some example embodiments, the oxygen exchanging layer may include a first region and a second region having different oxygen concentrations. The first region of the oxygen exchanging layer may be disposed on the oxygen supplying layer and the second region of the oxygen exchanging layer may be disposed between the first region and the second electrode. The second region may have a greater oxygen concentration than the first region.

According to at least one other example embodiment, a memory device includes: a plurality of first wirings arranged parallel with one another; a plurality of second wirings crossing the first wirings and arranged parallel with one another; and a memory cell formed at each cross-point between the first wirings and the second wirings. Each memory cell includes: a memory layer disposed between the first wiring and the second wiring; and a buffer layer disposed between the memory layer and the first wiring. The memory layer includes: an oxygen supplying layer and an oxygen exchanging layer, and has a resistance change characteristic due to movement of ionic species between the oxygen supplying layer and the oxygen exchanging layer.

At least one other example embodiment provides a memory device including: a plurality of first wirings arranged in parallel with one another; a plurality of second wirings crossing the first wirings and arranged in parallel with one another; and a memory cell formed at each cross-point between the first wirings and the second wirings. Each memory cell includes: a memory layer and a buffer layer disposed between the memory layer and the first wiring. The memory layer is disposed between the first wiring and the second wiring and includes a first material layer and a second material layer configured to exchange ionic species to change the resistance state of the memory layer. The first material layer may be an oxygen supplying layer and the second material layer may be an oxygen exchanging layer.

At least one other example embodiment provides a memory system including: at least one memory device; and a controller configured to exchange electric signals with the at least one memory device. The at least one memory device includes: a plurality of first wirings arranged in parallel with one another; a plurality of second wirings crossing the first wirings and arranged in parallel with one another; and a memory cell formed at each cross-point between the first wirings and the second wirings. Each memory cell includes: a memory layer and a buffer layer disposed between the memory layer and the first wiring. The memory layer is disposed between the first wiring and the second wiring and includes a first material layer and a second material layer configured to exchange ionic species to change the resistance state of the memory layer. The first material layer may be an oxygen supplying layer and the second material layer may be an oxygen exchanging layer.

According to at least some example embodiments, the memory cell may further include: a switching element disposed between the memory layer and the second wiring; and an intermediate electrode disposed between the memory layer and the switching element.

The oxygen supplying layer may be formed of a first metal oxide, and the oxygen exchanging layer may be formed of a second metal oxide. The second metal oxide may be from the same group as the first metal oxide. Alternatively, the second metal oxide may be from a different group than the first metal oxide.

According to at least some example embodiments, the first metal oxide may include at least one of: Ta oxide, Ti oxide, Zr oxide, yttria-stabilized zirconia (YSZ), Hf oxide, Mn oxide, and Mg oxide, and a combination thereof. For example, the first metal oxide may include $TaO_x$, wherein x is $0<x<2.5$ or $0.5 \leq x \leq 2.0$. The second metal oxide may include at least one of: Ta oxide, Ti oxide, Zr oxide, yttria-stabilized zirconia (YSZ), Hf oxide, Mn oxide, and Mg oxide, and a combination thereof.

The oxygen exchanging layer may be a material layer of which oxygen concentration varies one of gradually and in stages in a direction in which the oxygen exchanging layer is deposited. The oxygen concentration of the oxygen exchanging layer may increase from the oxygen supplying layer toward the second wiring.

According to at least some example embodiments, the buffer layer may include at least one of: $AlO_x$, $SiO_x$, $SiN_x$, $ZrO_x$, and $HfO_x$, and a combination thereof.

The first wiring may include at least one of: W, Ni, Al, Ti, Ta, TiN, TiW, TaN, IZO, ITO, $IrO_2$, Ir, Ru, Pd, Au, and Pt.

An electrode contacting the memory layer may include at least one of: $IrO_2$, Ir, Ru, Pd, Au, and Pt.

The memory device may further include a plurality of third wirings arranged to cross the second wirings on the second wirings; and a second memory cell formed at each cross-point between the second wirings and the third wirings.

The second memory cell may have a different (e.g., reverse or inverse) structure than the first memory cell. Alternatively, the second memory cell may have the same structure as the first memory cell.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
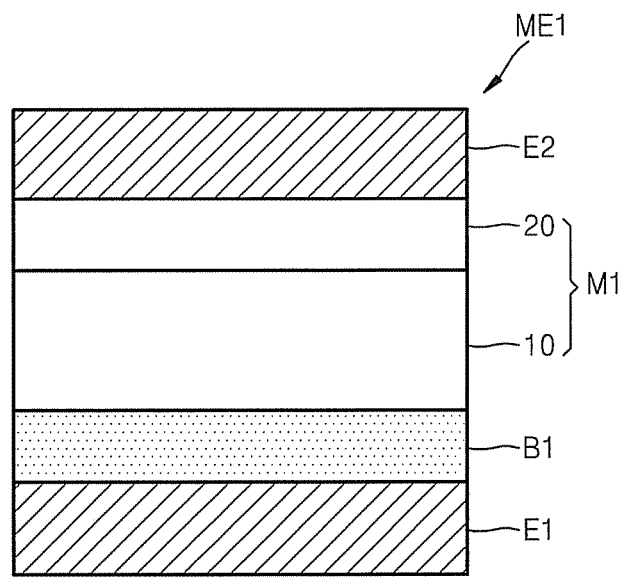
FIG. 1 is a cross-sectional view illustrating a memory element according to an example embodiment.

Various example embodiments will now be described more fully with reference to the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

FIG. 1 is a cross-sectional view illustrating a non-volatile memory element ME1 according to an example embodiment.

Referring to FIG. 1, the non-volatile memory element (hereinafter, referred to as a memory element) ME1 includes a memory layer M1 formed between first electrode E1 and a second electrode E2. In at least this example embodiment, the memory layer M1 has a multi-layer structure. In FIG. 1, for example, the memory layer M1 has a double layer structure including a first material layer 10 and a second material layer 20. In this example embodiment, the memory layer M1 has a variable resistance characteristic due to movement of ionic species between the first material layer 10 and the second material layer 20, which will be described in more detail later. The first material layer 10 and the second material layer 20 are configured to exchange ionic species to vary/change the resistance state of the memory layer M1.

A buffer layer B1 is arranged between the memory layer M1 and the first electrode E1. More specifically, for example, the buffer layer B1 is arranged between the first material layer 10 and the first electrode E1. The buffer layer B1 may improve the reliability, reproducibility, stability, etc. of the memory layer M1.

The first material layer 10 may be formed of a first metal oxide such as a transition metal oxide. In this case, the first material layer 10 may function as an oxygen supplying layer with respect to the second material layer 20. The first material layer 10 may include at least one of: Ta oxide, Ti oxide, Zr oxide, yttria-stabilized zirconia (YSZ), Hf oxide, Mn oxide, and Mg oxide, a combination thereof, and the like.

In a more specific example, the first material layer 10 may include a Ta oxide such as $TaO_x$, wherein x is about $0<x<2.5$ or about $0.5 \leq x \leq 2.0$. Oxygen ions and/or oxygen vacancies may exist in the first material layer 10.

A thickness of the first material layer 10 may be in the range of between about 1 nm and about 100 nm, inclusive. For example, the thickness of the first material layer 10 may be between about 5 nm and about 50 nm, inclusive.

Still referring to the example embodiment shown in FIG. 1, the second material layer 20 may exchange oxygen ions and/or oxygen vacancies with the first material layer 10 thereby inducing a change in the resistance state of the memory layer M1. In this regard, the second material layer 20 may be referred to as an oxygen exchanging layer.

The second material layer 20 may be formed of a second metal oxide. The second metal oxide may be of the same or a different group than the first metal oxide. For example, the second metal oxide may include at least one of: Ta oxide, Ti oxide, Zr oxide, YSZ (yttria-stabilized zirconia), Hf oxide, Mn oxide, and Mg oxide, a combination thereof, and the like.

In a more specific example, the second metal oxide may have a stoichiometric composition or a composition relatively close or substantially close to a stoichiometric composition. For example, the second metal oxide may be formed of a Ta oxide such as a $Ta_2O_5$ layer or may have a composition relatively close or substantially close to $Ta_2O_5$. The second material layer 20 may include oxygen ions and/or oxygen vacancies similar to the first material layer 10. And, an oxygen mobility and/or an oxygen diffusivity of the second material layer 20 may be similar to, substantially similar to or greater than that of the first material layer 10.

A resistivity of the second material layer 20 may be different from that of the first material layer 10. For example, the resistivity of the second material layer 20 may be greater than the resistivity of the first material layer 10.

According to at least the above-discussed example embodiment, in an ON state when a current path is formed in the second material layer 20, the resistance of the memory layer M1 is determined by the resistance of the first material layer 10. In an OFF state when a current path is not formed in the second material layer 20, the resistance of the memory layer M1 is determined by the resistance of the second material layer 20.

An oxygen concentration of the second material layer 20 may be higher than the oxygen concentration of the first material layer 10. However, under different conditions, the oxygen concentration of the second material layer 20 may not be higher than that of the first material layer 10. For example, when the second material layer 20 is formed of a metal oxide from the same group as the first material layer 10, the oxygen concentration of the second material layer 20 may be higher than that of the first material layer 10. However, when the second material layer 20 is formed of a metal oxide from a different group than the first material layer 10, the oxygen concentration of the second material layer 20 need not be higher than that of the first material layer 10.

A thickness of the second material layer 20 may be in the range of between about 1 nm and about 50 nm, inclusive. For example, the thickness of the second layer 20 may be between about 5 nm and about 30 nm, inclusive. The thickness of the second material layer 20 may be less than the thickness of the first material layer 10 (e.g., the second material layer 20 may be thinner than the first material layer 10).

A resistance change characteristic, such as speed and/or an ON/OFF ratio, of the memory element ME1 may vary according to a property of the second material layer 20 (e.g., the oxygen exchanging layer).

Still referring to FIG. 1, the buffer layer B1 may improve the reliability, reproducibility, stability, etc. of the resistance change characteristic of the memory layer M1. In one example, the buffer layer 81 may include a material having an interatomic bonding energy greater than that of the memory layer M1. For example, the interatomic bonding energy in the buffer layer 81 may be greater than the interatomic bonding energy (e.g., Ta—O bonding energy) in the first material layer 10. In this example, the buffer layer B1 may be formed of a material that is more stable than the memory layer M1 in terms of interatomic bonding energy. In addition, the buffer layer B1 may include a material that results in an increased potential barrier between the first electrode E1 and the memory layer M1. For example, a conduction band offset between the buffer layer 81 and the first electrode E1 may be greater than the conduction band offset between the first material layer 10 and the first electrode E1. Thus, the buffer layer B1 may be formed of a material that suppresses and/or inhibits excessive current flow between the first electrode E1 and the first material layer 10. Similarly, the buffer layer B1 may include a material having a resistivity greater than that of the memory layer M1.

In more detail, for example, the buffer layer B1 may include at least one of: $AlO_x$, $SiO_x$, $SiN_x$, $ZrO_x$, $HfO_x$, a combination thereof, or the like. The buffer layer B1 may or may not have a stoichiometric composition. The buffer layer B1 may have a composition and thickness such that the buffer layer B1 functions as a buffer and allows current flow. In one example, a thickness of the buffer layer 81 may be less than or equal to about 10 nm. If the buffer layer B1 has a stoichiometric composition, the thickness of the buffer layer 81 may be less than or equal to about 5 nm. When the buffer layer B1 is excessively thick, an insulating property of the buffer layer 81 increases. Therefore, as described above, the buffer layer 81 may be less than or equal to about 10 nm.

The first electrode E1 may be formed of a base metal such as W, Ni, Al, Ti, Ta, TiN, TiW, TaN, or a conductive oxide such as indium-zinc-oxide (IZO) or indium-tin-oxide (ITO).

In at least this example embodiment, the buffer layer B1 allows for a more stable memory characteristic to be obtained without forming the first electrode E1 of a relatively high-priced (costly) noble metal. When the first electrode E1 is formed of a relatively high-priced noble metal (e.g., Pt) material having a relatively low reactivity the buffer layer B1 may not be needed, but manufacturing costs may increase. Additionally, even if the first electrode E1 is formed of a noble metal, when the buffer layer B1 is not used, it may be relatively difficult to obtain reproducibility and/or stability of a resistance change characteristic. In at least this example embodiment, because the buffer layer B1 is used, reproducibility and/or stability of a memory characteristic may be obtained more easily even though the first electrode E1 is formed of a relatively low-priced material. However, in at least this example embodiment, a noble metal material may be used as a material for forming the first electrode E1. For example, the first electrode E1 may be formed of a noble metal material such as Ir, Ru, Pd, Au, Pt or a metal oxide such as $IrO_2$. Therefore, the first electrode E1 may include at least one of: W, Ni, Al, Ti, Ta, TiN, TiW, TaN, IZO, ITO, $IrO_2$, Ir, Ru, Pd, Au, and Pt. In addition, although not described, the first electrode E1 may be formed of various electrode materials generally used in semiconductor devices.

The second electrode E2 may be formed of a metal oxide such as $IrO_2$ or a metal such as Ir. A Pt electrode is generally used in non-volatile memory devices because the Pt electrode has a relatively low reactivity and allows for obtaining a memory characteristic relatively easily. However, Pt electrodes are relatively expensive and etching (e.g., patterning) Pt is relatively difficult. According to at least this example embodiment, $IrO_2$, Ir, etc., which are less costly than Pt and may be etched (patterned) more easily, are used. Even though the second electrode E2 is formed of $IrO_2$ or Ir, sufficient (e.g., excellent) memory characteristics may be obtained, which will be described in more detail later with reference to FIGS. 4 to 7. In at least this, example embodiment, other metals (e.g., noble metals), except for $IrO_2$ and Ir, are not excluded as a material for forming the second electrode E2. The second electrode E2 may be formed of Ru, Pd, Au or Pt, as desired. Accordingly, the second electrode E2 may be formed of at least one of: $IrO_2$, Ir, Ru, Pd, Au and Pt.

Hereinafter, a resistance change mechanism of the non-volatile memory element of FIG. 1 will be described in more detail with reference to FIGS. 2A and 2B.

Figure 2A:
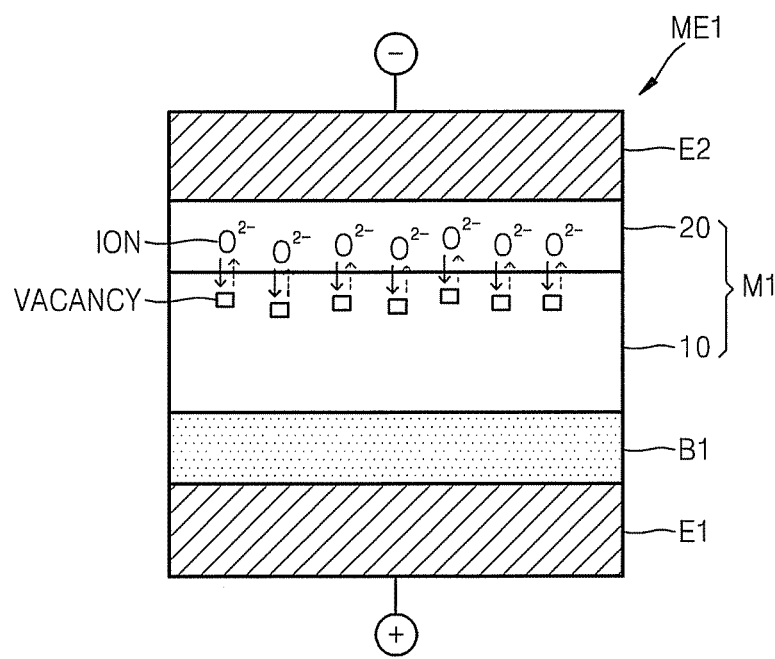
FIGS. 2A and 2B are cross-sectional views for explaining an example operational mechanism of the memory element of FIG. 1.

FIG. 2A illustrates a set operation in which a positive voltage is applied to the first electrode E1 and a negative voltage is applied to the second electrode E2. As shown in FIG. 2A, during this set operation oxygen vacancies move from the first material layer 10 to the second material layer 20. As a result, a current path (not shown) is formed in the second material layer 20, and a resistance of the memory layer M1 decreases. In this case, the memory layer M1 changes between resistance states, from an OFF state to an ON state. In the set operation, oxygen ions move in a direction opposite to that of the oxygen vacancies, that is, from the second material layer 20 to the first material layer 10.

Figure 2B:
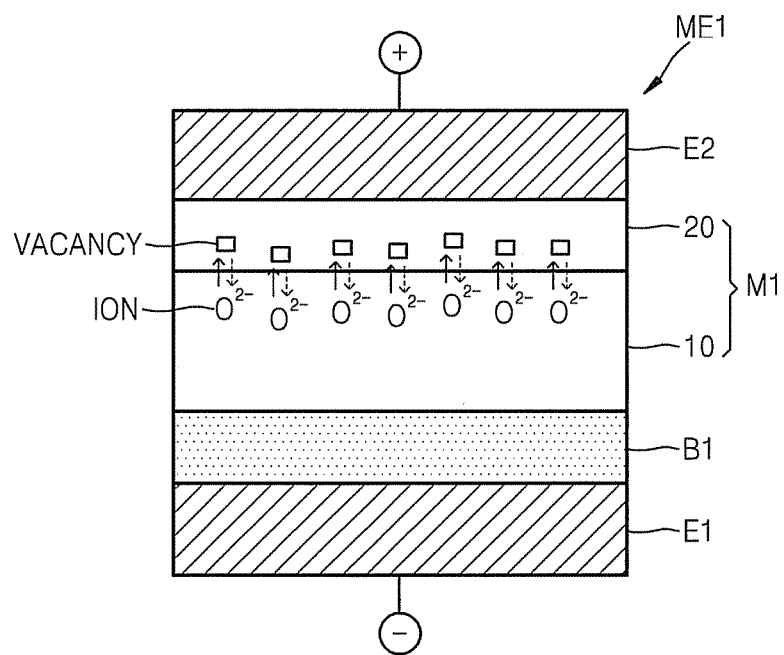

FIG. 2B shows a reset operation in which a negative voltage is applied to the first electrode E1 and a positive voltage is applied to the second electrode E2. As shown in FIG. 2B, during this reset operation oxygen vacancies move from the second material layer 20 to the first material layer 10, while oxygen ions move from the first material layer 10 to the second material layer 20. In this case, the current path formed in the second material layer 20 is broken, and a resistance of the memory layer M1 increases. Accordingly, the memory layer M1 changes between resistance states, from an ON state to an OFF state.

As described above, the buffer layer B1 may function to improve stability, reliability, and/or reproducibility of a resistance change characteristic during the set/reset operations. When the buffer layer B1 is not formed, oxygen ions and/or oxygen vacancies may move toward the first electrode E1 so as to physically and/or chemically react with the first electrode E1, or the memory layer M1 itself may physically and/or chemically react with the first electrode E1. These reactions may reduce stability, reliability, and/or reproducibility of the resistance change characteristic of the memory element ME1. For example, these reactions may result in a breakdown phenomenon in which an amount of current flow between the first electrode E1 and the second electrode E2 rapidly increases. In addition, the reaction between the memory layer M1 and the first electrode E1 may result in an undesirable material layer being formed at an interface between the memory layer M1 and the first electrode E1. This undesirable material layer may deteriorate a resistance change characteristic of the memory element. Such problems may be more substantial when the first electrode E1 is formed of a relatively low-priced base metal. Furthermore, repetitive ON/OFF switching operations may increase the likelihood of the above-discussed reactions. Moreover, when a $TaO_x$ layer is used as a resistance change material, a resistance change characteristic changes relatively significantly according to a method of forming the $TaO_x$ layer, a deposition condition, and a content of oxygen. Thus, it is relatively difficult to obtain reproducible and/or stable resistance change characteristics.

However, as described with regard to at least this example embodiment, the buffer layer B1 formed between the first electrode E1 and the memory layer M1 may improve stability, reliability, and/or reproducibility of resistance change characteristics of the memory element ME1. For example, the buffer layer B1 may function to suppress and/or inhibit/prevent chemical reactions between the first electrode E1 and the first material layer 10 and/or between the first electrode E1 and ionic species of the first material layer 10 during an initial set operation (e.g., a forming operation). In addition, the buffer layer B1 may suppress and/or inhibit/prevent reactions between the first material layer 10 and the first electrode E1 when forming the first material layer 10.

The buffer layer B1 also enables the first electrode E1 to be formed not only of a noble metal, but also of a relatively low-priced base metal and a conductive oxide. In practice, it may be relatively difficult to form the first electrode E1 of a base metal having a relatively high reactivity or a conductive oxide without the buffer layer B1. When the first electrode E1 is formed of only a noble metal (e.g., Pt), manufacturing costs may be increased and/or manufacturing process restrictions may exist. However, in accordance with at least some example embodiments, the first electrode E1 may be formed more easily not only of a noble metal, but also of a base metal and a conductive oxide. Accordingly, manufacturing costs may be reduced.

Figure 3:
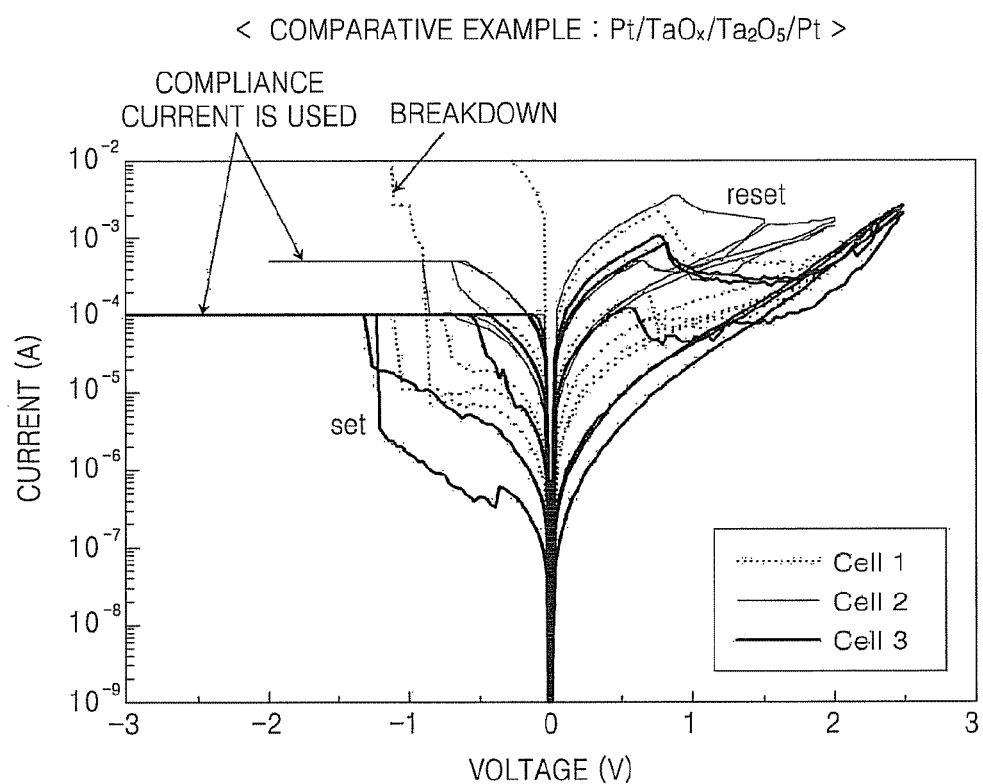
FIG. 3 is a graph showing an example voltage-current characteristic of a memory element having a $Pt/TaO_x/Ta_2O_5/Pt$ structure according to a comparative example.

FIG. 3 is a graph showing an example voltage-current characteristic of a memory element according to a comparative example. The memory element according to the comparative example has a structure of $Pt/TaO_x/Ta_2O_5/Pt$. Thus, the memory element according to the comparative example uses a noble metal (Pt) electrode without a buffer layer. In this comparative example, $TaO_x$ and $Ta_2O_5$ correspond to the first material layer 10 and the second material layer 20 of FIG. 1, respectively. And, the upper and lower electrodes are formed of Pt.

Referring to FIG. 3, cell-to-cell non-uniformity of a resistance change characteristic is relatively substantial, and the distribution of ON and OFF current is relatively great with respect to one cell according to the number of measurements. In addition, during a set operation, if the amount of current flowing to the memory element is not controlled by using a given, desired or predetermined level of compliance current, the amount of current flowing to the memory element increases relatively rapidly, thereby resulting in a breakdown phenomenon. As such, in the memory element without a buffer layer, the memory characteristics may not be sufficiently stable, reliable and/or reproducible. Moreover, it may be relatively difficult (e.g., practically impossible) to repeat ON/OFF driving operations for relatively long periods of time by using a normal operation pulse.

Figure 4:
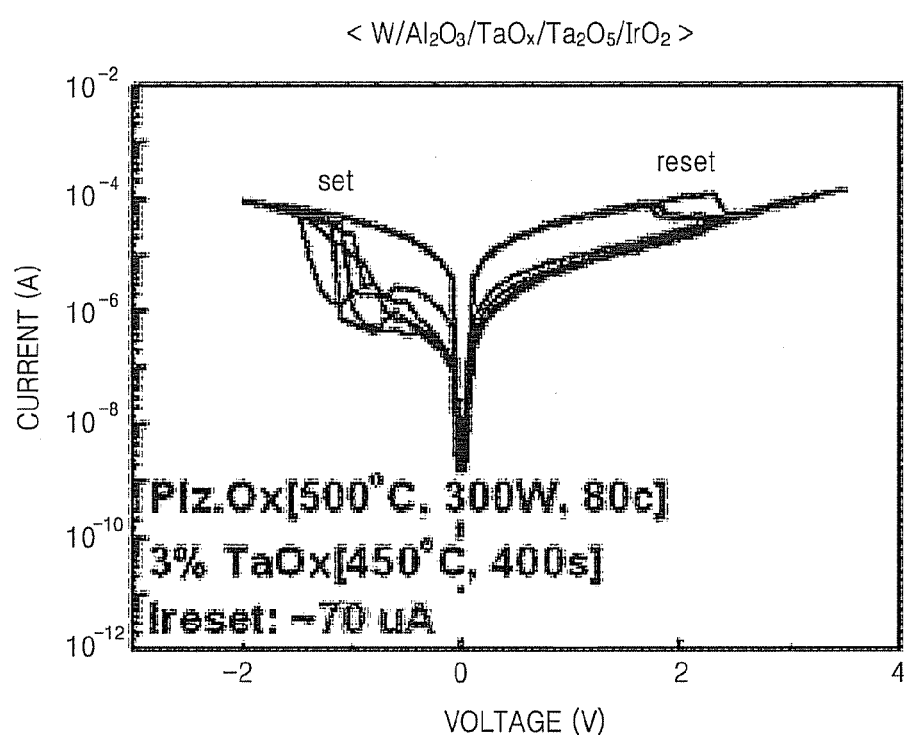
FIG. 4 is a graph showing an example voltage-current characteristic of a memory element having a $W/Al_2O_3/TaO_x/Ta_2O_5/IrO_2$ structure according to an example embodiment.

FIG. 4 is a graph showing an example voltage-current characteristic of a memory element according to an example embodiment. The memory element discussed with regard to FIG. 4 has a $W/Al_2O_3/TaO_x/Ta_2O_5/IrO_2$ structure. The memory element according to this example embodiment has a structure of the memory element shown in FIG. 1, and the first electrode E1, the buffer layer B1, the first material layer 10, the second material layer 20, and the second electrode E2 are formed of W, $Al_2O_3$, $TaO_x$, $Ta_2O_5$, and $IrO_2$, respectively.

Referring to FIG. 4, the memory element has a resistance change characteristic (a bipolar memory switching characteristic) with improved uniformity and stability compared to the memory element of FIG. 3. Although FIG. 4 shows a bipolar memory switching characteristic, example embodiments may also be applicable to memory elements having a unipolar switching characteristic. In a memory element having a unipolar memory switching characteristic, the memory element changes between the set and the reset state in response to voltages having the same polarity. In a memory element having a bipolar memory switching characteristic, the memory element changes between the set and the reset state in response to voltages having different polarities.

Still referring to FIG. 4, even though a compliance current is not used during a set operation, a rapid increase in the amount of current is suppressed and/or inhibited/prevented. Thus, a breakdown phenomenon does not occur. And, even though a relatively low-priced material, such as W or $IrO_2$, is used as an electrode material, a relatively stable characteristic is achieved.

Figure 5:
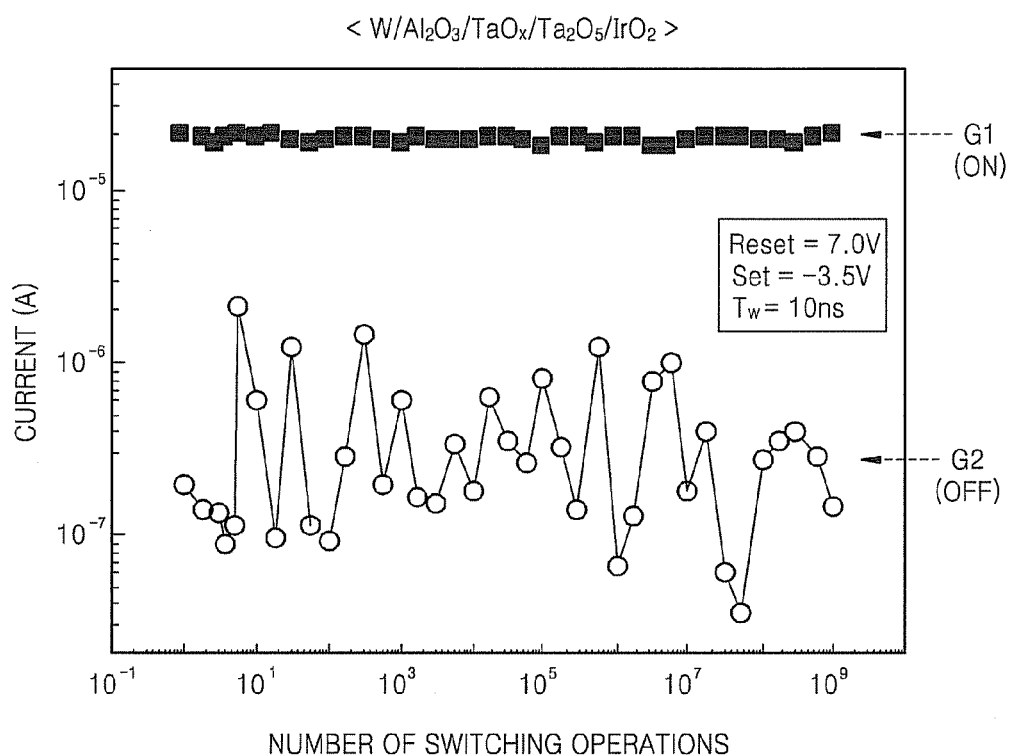
FIG. 5 is a graph showing example variations in ON and OFF current according to the number of switching operations of a memory element having the $W/Al_2O_3/TaO_x/Ta_2O_5/IrO_2$ structure.

FIG. 5 is a graph showing example variations in ON and OFF current according to the number of switching operations of a memory element according to an example embodiment. The results shown in FIG. 5 refer to the memory element described in FIG. 4 (e.g., the $W/Al_2O_3/TaO_x/Ta_2O_5/IrO_2$ structure). In FIG. 5, the first graph G1 shows ON current, whereas the second graph G2 shows OFF current.

Referring to FIG. 5, even though a switching operation (an ON/OFF operation) is repeated more than $10^9$ times, a relatively stable resistance change characteristic is maintained. As shown, an ON/OFF current ratio is about 2 orders of magnitude (e.g., about $10^2$).

Figure 6:
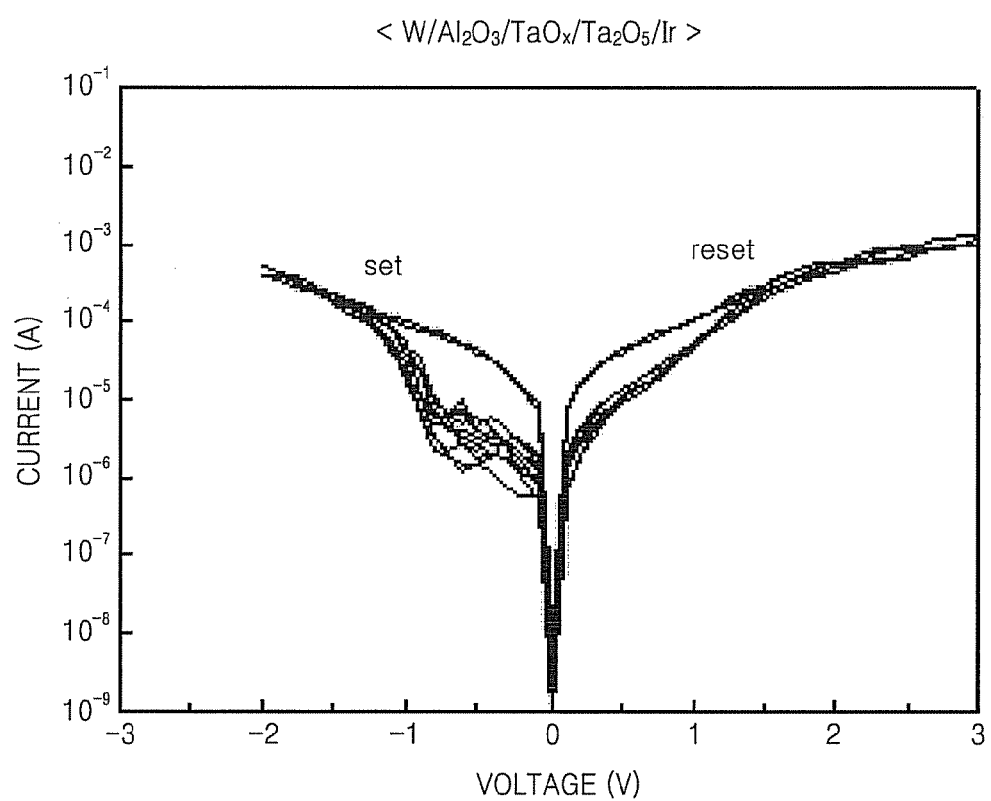
FIG. 6 is a graph showing an example voltage-current characteristic of a memory element having a $W/Al_2O_3/TaO_x/Ta_2O_5/Ir$ structure according to another example embodiment.

FIG. 6 is a graph showing an example voltage-current characteristic of a memory element according to another example embodiment. The memory element discussed with regard to FIG. 6 has a structure of W/$Al_2O_3$/$TaO_x$/$Ta_2O_5$/Ir. That is, the memory element according to this example embodiment has a structure of the memory element of FIG. 1 in which the first electrode E1, the buffer layer B1, the first material layer 10, the second material layer 20, and the second electrode E2 are formed of W, $Al_2O_3$, $TaO_x$, $Ta_2O_5$, and Ir, respectively.

Referring to FIG. 6, the memory element has a relatively uniform and stable resistance change characteristic, similar to the memory element of FIG. 4. Even though a relatively low-priced material (e.g., W or Ir, which are relatively low-priced materials when compared to Pt) is used as an electrode material, a memory characteristic of the memory element may be improved.

Figure 7:
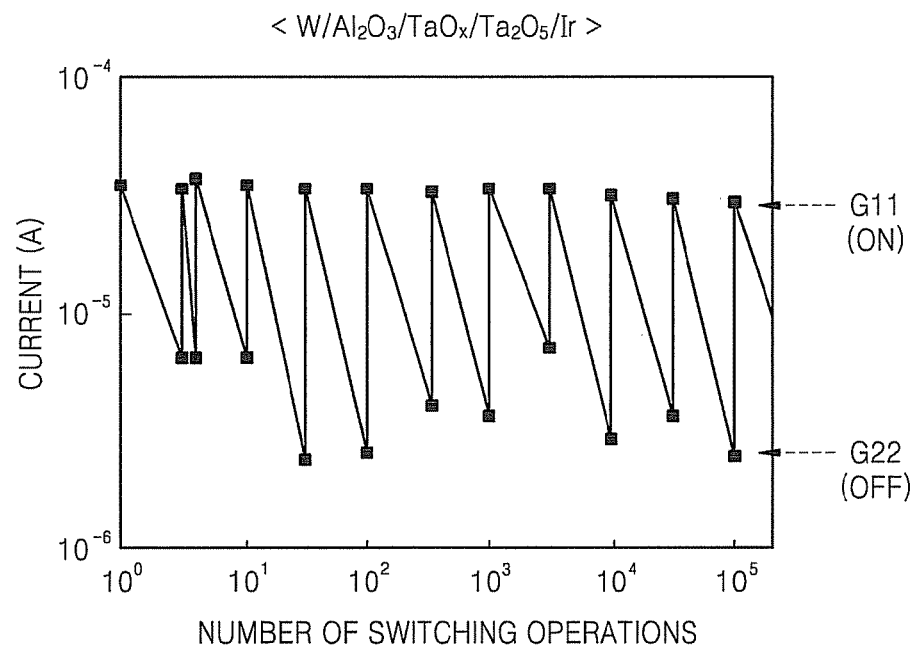
FIG. 7 is a graph showing example variations in ON and OFF current according to the number of switching operations of a memory element having the $W/Al_2O_3/TaO_x/Ta_2O_5/Ir$ structure.

FIG. 7 is a graph showing example variations in ON and OFF current according to the number of switching operations of a memory element according to another example embodiment. The results shown in FIG. 7 refer to the memory element described with regard to FIG. 6 (a structure of W/$Al_2O_3$/$TaO_x$/$Ta_2O_5$/Ir). In FIG. 7, a first graph G11 shows ON current, and a second graph G22 shows OFF current.

Referring to FIG. 7, even though a switching operation (an ON/OFF operation) is repeated more than $10^5$ times, a relatively stable resistance change characteristic is maintained.

Figure 8:
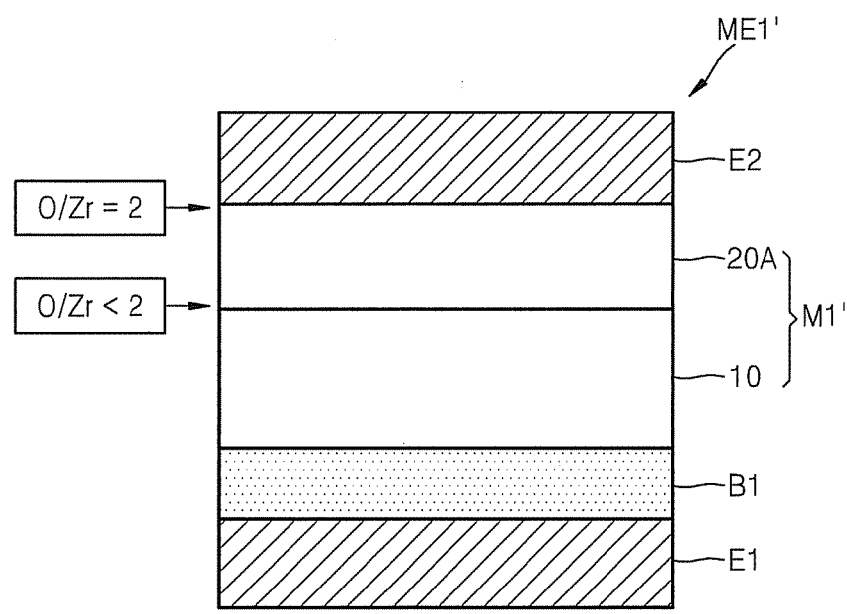
FIGS. 8 and 9 are cross-sectional views illustrating a memory element according to another example embodiment.
Figure 9:
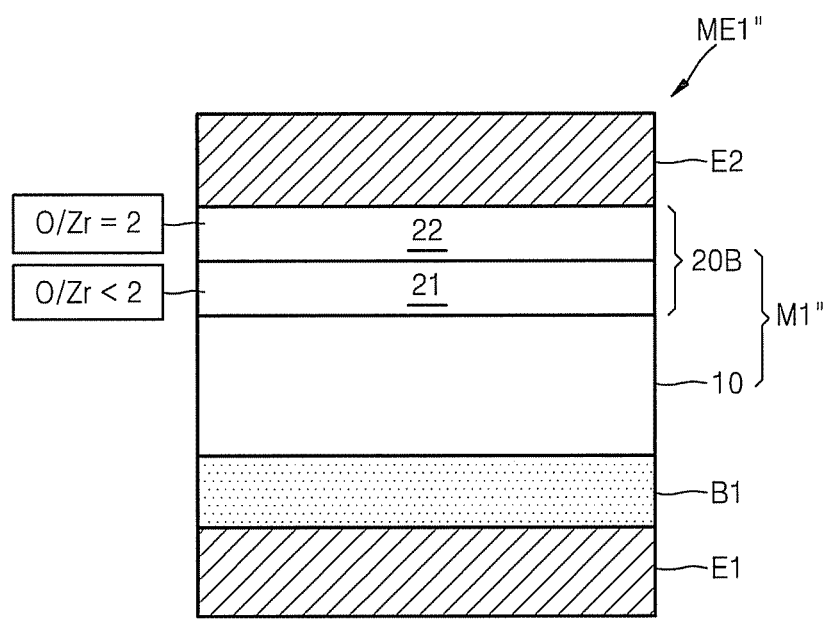

In the above-described example embodiment, an oxygen concentration of the second material layer 20 may be relatively uniform in a deposition direction (e.g., a thickness direction). However, according to at least one other example embodiment, a second material layer of which oxygen concentration changes in a deposition direction (e.g., a thickness direction) may be used as illustrated in FIGS. 8 and 9. In FIGS. 8 and 9, each of M1' and M1" denotes a memory layer, and each of ME1' and ME1" denotes a memory element.

Referring to FIG. 8, a second material layer 20A may be a material layer of which oxygen concentration gradually changes in a deposition direction (e.g., a thickness direction). In this example, the oxygen concentration of the second material layer 20A may gradually increase from the first material layer 10 toward the second electrode E2. In a more specific example, when the second material layer 20A is a Zr oxide layer, an O/Zr ratio of a portion of the second material layer 20A contacting the first material layer 10 may be in the range of between about 1 and about 1.5, inclusive, whereas an O/Zr ratio of a portion of the second material layer 20A contacting the second electrode E2 may be about 2.

Referring to FIG. 9, a second material layer 20B may be a material layer in which the oxygen concentration changes in stages in a deposition direction (e.g., a thickness direction). In this example, the second material layer 20B includes discrete regions in which the oxygen concentration changes. In a more specific example, as shown in FIG. 9, the second material layer 20B includes a first region 21 contacting the first material layer 10 and a second region 22 contacting the second electrode E2. An oxygen concentration of the second region 22 is higher than that of the first region 21. For example, when the second material layer 20B is a Zr oxide layer, an O/Zr ratio of the first region 21 may be in the range of between about 1 and about 1.5, inclusive, whereas an O/Zr ratio of the second region 22 may be about 2.

According to at least the example embodiments shown in FIGS. 8 and 9, the portion of the second material layers 20A and 20B closer or adjacent to the second electrode E2 may have a stoichiometric composition or a composition relatively close to a stoichiometric composition, whereas a portion of the second material layers 20A and 20B closer or adjacent to the first material layer 10 may have a non-stoichiometric composition. In the second material layers 20A and 20B, the portion adjacent to the first material layer 10 may affect a resistance change more significantly than the portion adjacent to the second electrode E2.

The variation in the oxygen concentration of the second material layers 20A and 20B in the deposition direction of the second material layers 20A and 20B may improve resistance change characteristics of the memory elements ME1' and ME1". For example, upper portions of the second material layers 20A and 20B (e.g., the portion contacting the second electrode E2 and having a stoichiometric composition or a composition relatively close to a stoichiometric composition) may increase an ON/OFF resistance ratio of the memory elements ME1' and ME1" because the upper portions of the second material layers 20A and 20B have a relatively high resistance compared to remaining regions and/or separate lower portions of the second material layers 20A and 20B (e.g., a region contributing to the resistance change characteristic due to exchange of ionic species) from the second electrode E2. Accordingly, an OFF current level may decrease, and an ON/OFF resistance ratio may increase.

In addition, the change in the oxygen concentrations in a deposition direction of the second material layers 20A and 20B may improve reliability, reproducibility, uniformity, stability, etc. of the memory elements ME1' and ME1". The upper portions of the second material layers 20A and 20B (e.g., the portion contacting the second electrode E2 and having a stoichiometric composition or a composition relatively close to a stoichiometric composition) may suppress and/or prevent/inhibit the remaining regions of the second material layers 20A and 20B (e.g., the regions substantially contributing to the resistance change characteristic) from physically and/or chemically reacting with the second electrode E2. During set/reset operations for exchanging ionic species between the first material layer 10 and the second material layer 20, oxygen ions and/or oxygen vacancies of the second material layers 20A and 20B may move to the second electrode E2 to physically and/or chemically react with the second electrode E2, or the second material layers 20A and 20B themselves may physically and/or chemically react with the second electrode E2, thereby reducing reliability, reproducibility, uniformity, and/or stability of the resistance change characteristic of the memory element.

However, if the oxygen concentrations of the second material layers 20A and 20B vary in a direction of the thickness of the second material layers 20A and 20B (e.g., if a region having a relatively high oxygen concentration is formed in the portion of the second material layers 20A and 20B contacting the second electrodes E2) as in some example embodiments, the region having the relatively high oxygen concentration may function as a buffer to suppress and/or prevent/inhibit the remaining regions of the second material layers 20A and 20B (e.g., the region substantially contributing to the resistance change characteristic) from physically and/or chemically reacting with the second electrode E2. The regions (e.g., the upper portions) of the second material layers 20A and 20B having relatively high oxygen concentrations may have a stoichiometric composition or a composition relatively close to a stoichiometric composition, and thus, may be more stable than the remaining regions (e.g., the lower portions of the second material layers 20A and 20B) in terms of interatomic bonding energy. Accordingly, the regions (e.g., the upper portions) having relatively high oxygen concentrations may increase a potential barrier between the remaining portions (e.g., the lower portions of the second material layers 20A and 20B and the second electrode E2). In other words, for example, an excessive current flow and/or movement of ionic species between the lower portions of the second material layers 20A and 20B and the second electrode E2 may be suppressed and/or prevented/inhibited. The regions (e.g., the upper portions) having relatively high oxygen concentrations of the second material layers 20A and 20B may have a proper composition and thickness so as to function as a buffer and allow current flow.

As such, when oxygen concentrations of the second material layers 20A and 20B are changed in a deposition direction, the regions (e.g., the upper portions) of the second material layers 20A and 20B having relatively high oxygen concentrations function as a buffer, which enables the second electrode E2 to be formed of a relatively low-priced base metal or a conductive oxide in addition to $IrO_2$, Ir, Ru, Pd, Au, or Pt. Consequently, the second electrode E2 may be formed of the same materials as the first electrode E1.

In addition, when oxygen concentrations of the second material layers 20A and 20B vary in a deposition direction, the second material layers 20A and 20B may be thicker than the second material layer 20 of FIG. 1.

Memory elements according to at least some example embodiments may be used in memory devices having various structures. The memory device may further include a switching element connected to the memory element.

Figure 10:
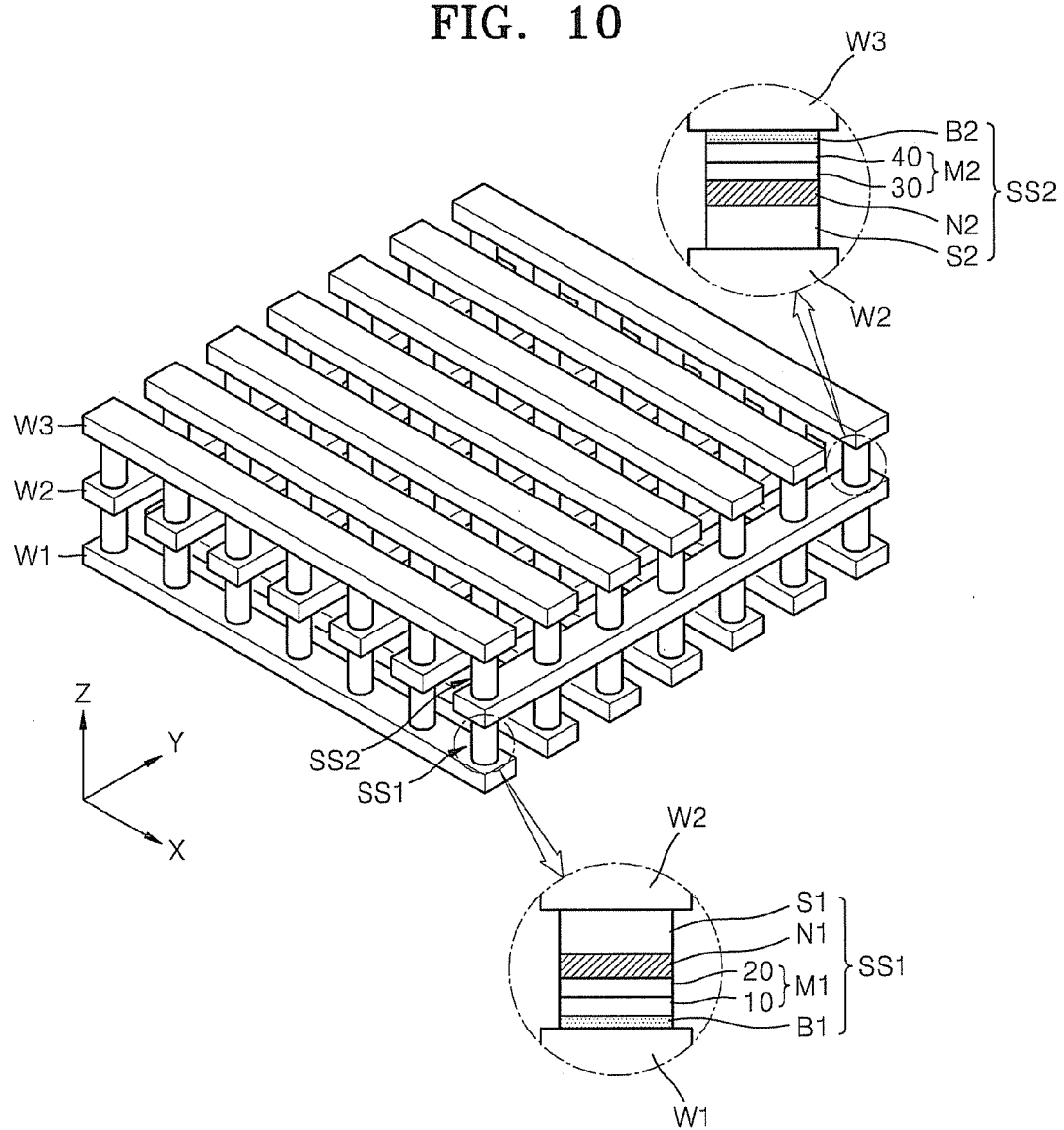
FIG. 10 is a perspective view illustrating a memory device including a memory element according to an example embodiment.

FIG. 10 is a perspective view illustrating a memory device including a memory element according to an example embodiment. The memory device shown in FIG. 10 is a cross-point resistive memory device.

Referring to FIG. 10, a plurality of first wirings W1 are formed in parallel or substantially parallel with one another in a first direction (e.g., in an X-direction). A plurality of second wirings W2 are formed in a direction crossing (e.g., perpendicular or substantially perpendicular to) the first wirings W1 (e.g., in a Y-direction). Each of a plurality of first stack structures (first memory cell) SS1 are formed at a cross-point between the first wirings W1 and the second wirings W2. The first stack structure SS1 includes a first buffer layer B1, a first memory layer M1, a first intermediate electrode N1, and a first switching element S1 that are sequentially stacked on the first wiring W1. In the first stack structure SS1, positions of a lower structure (e.g., B1 and M1), and an upper structure S1 may be switched around the first intermediate electrode N1. The first buffer layer 81 and the first memory layer M1 may correspond to the buffer layer 81 and the memory layer M1 of FIG. 1, respectively. The first switching element S1 may be a two-way diode, a threshold switching device, a varistor, or the like. When the first switching element S1 is a two-way diode, the two-way diode may be, for example, an oxide diode.

When a silicon diode is used, the silicon diode may be formed using a relatively high-temperature process at a temperature of about 800° C., and thus, there is a restriction in selecting a substrate, and the relatively high-temperature process may be problematic. Accordingly, forming the first switching element S1 of an oxide layer that is more easily formed at room temperature may be advantageous. However, according to at least some example embodiments, silicon is not excluded as a material for forming the first switching element S1. The first switching element S1 may be formed of silicon or any of various materials. The first wiring W1 and the first intermediate electrode N1 may correspond to the first electrode E1 and the second electrode E2 of FIG. 1, respectively. Accordingly, the first wiring W1 may include at least one of W, Ni, Al, Ti, Ta, TiN, TiW, TaN, IZO, ITO, $IrO_2$, Ir, Ru, Pd, Au, and Pt, and first intermediate electrode N1 may include at least one of $IrO_2$, Ir, Ru, Pd, Au, and Pt. The second wiring W2 may or may not be formed of a material that is the same or substantially the same as that of the first wiring W1.

A plurality of third wirings W3 may be formed to be spaced apart from and in parallel or substantially parallel with upper surfaces of the second wirings W2. The plurality of third wirings W3 may be spaced apart from the upper surfaces of the second wirings W2 at a given, desired or predetermined interval. The third wirings W3 may cross (e.g., be perpendicular or substantially perpendicular to) the second wirings W2 and may be arranged at the same or substantially the same intervals. Each of a plurality of second stack structures (second memory cell) SS2 are formed at a cross-point between the second wirings W2 and the third wirings W3. The second stack structure SS2 may include a second switching element 52, a second intermediate electrode N2, a second memory layer M2, and a second buffer layer 82 that are sequentially stacked on the second wiring W2. In this case, the second stack structure SS2 has a reverse or inverse structure relative to the first stack structure SS1. A third material layer 30 and a fourth material layer 40 constituting the second memory layer M2 may correspond to the second material layer 20 and the first material layer 10, respectively. In this case, the second memory layer M2 has a reverse or inverse structure relative to the stacked structure of the memory layer M1 of FIG. 1. However, the second memory layer M2 may have a stacked structure that is the same as that of the memory layer M1 of FIG. 1. For example, the third material layer 30 and the fourth material layer 40 constituting the second memory layer M2 may correspond to the first material layer 10 and the second material layer 20, respectively. The second buffer layer 82 may be a material layer that is the same or substantially the same as the first buffer layer B1. The second buffer layer 82 is formed between the second intermediate electrode N2 and the second memory layer M2. The second switching element S2 has a reverse structure relative to the first switching element S1 or a stacked structure that is the same or substantially the same as the first switching element S1. The third wiring W3 and the second intermediate electrode N2 may correspond to the first electrode E1 and the second electrode E2 of FIG. 1, respectively, or to the second electrode E2 and the first electrode E1, respectively. In the second stack structure SS2, positions of a lower structure (e.g., S2) and an upper structure (e.g., M2 and 82) may be switched around the second intermediate electrode N2. According to at least one other example embodiment, the second stack structure SS2 may have a stacked structure that is the same or substantially the same as that of the first stack structure SS1.

Although the first and second stack structures SS1 and SS2 have a cylindrical shape in FIG. 10, the first and second stack structures SS1 and SS2 may have any of other various shapes such as a square pillar shape or a pillar shape of which a width increases downward. For example, the first and second stack structures SS1 and SS2 may have an asymmetrical shape enlarged to the outside of the cross-point between the first wiring W1 and the second wiring W2 and of the cross-point between the second wiring W2 and the third wiring W3. The shape of the memory device illustrated in FIG. 10 may be variously changed.

Although not shown in FIG. 10, the memory device of FIG. 10 may further include a stack structure that is the same or substantially the same as that including the first stack structure SS1 and the second wiring W2 on the third wiring W3.

Alternatively, the resistive memory device according to at least some example embodiments may further include at least one stack structure having the same or substantially the same structure as that including the first stack structure SS1, the second wiring W2, the second stack structure SS2, and the third wiring W3, on the third wiring W3.

Alternatively, the resistive memory device according to at least some example embodiments may further include at least one stack structure having the same or substantially the same structure as that in which the first stack structure SS1, the second wiring W2, the second stack structure SS2, the third wiring W3, the first stack structure SS1, and the second wiring W2 are sequentially stacked, on the third wiring W3.

Although FIG. 10 illustrates a case where the memory element of FIG. 1 is used in a cross-point memory device, the memory element described with regard to FIGS. 8 and 9 may also be used in a cross-point memory device.

Figure 11:
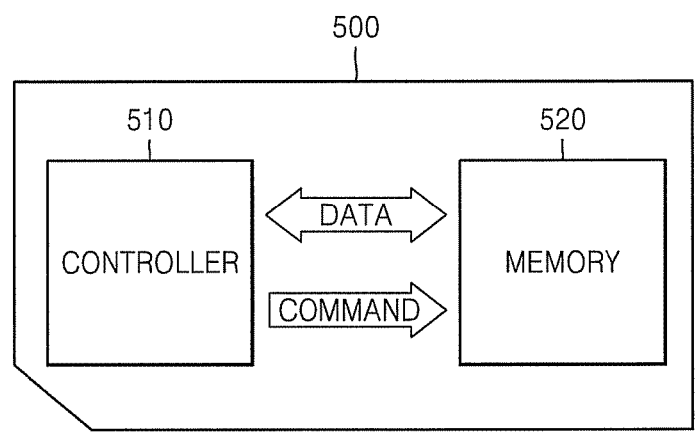
FIG. 11 is a schematic diagram illustrating a memory system according to an example embodiment.

FIG. 11 is a schematic diagram illustrating a memory system (e.g., a memory card) 500 according to an example embodiment. Referring to FIG. 11, a controller 510 and a memory device 520 are configured to exchange electric signals. In one example, the memory device 520 and the controller 510 may exchange data according to commands of the controller 510. The memory system 500 may store data in the memory device 520 and/or output data from the memory device 520. The memory device 520 may include at least one of the non-volatile memory elements and/or devices described above with regard to FIGS. 1-2B and 4-10.

Such a memory system 500 may be used as a storage medium for various portable electronic devices. For example, the memory system 500 may be a multimedia card (MMC) or a secure digital (SD) card.

Figure 12:
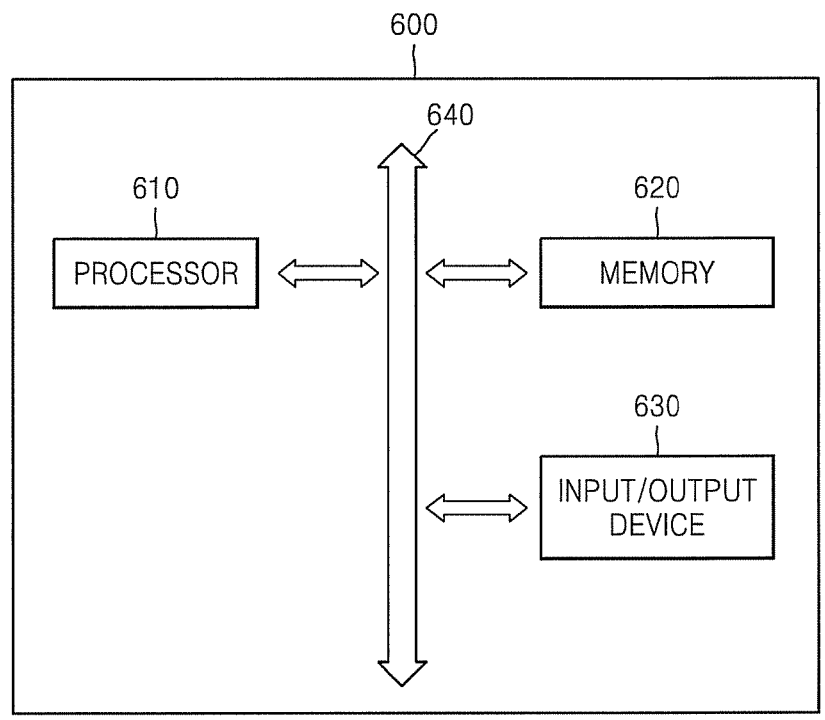
FIG. 12 is a block diagram illustrating an electronic system according to an example embodiment.

FIG. 12 is a block diagram roughly illustrating an electronic system 600 according to example embodiments. Referring to FIG. 12, a processor 610, an input/output device 630, and a memory device 620 are configured to perform data communication with each other via a bus 640. The processor 610 may execute programs and/or control the electronic system 600. The input/output device 630 may be used to input/output data to/from the electronic system 600. The electronic system 600 may be connected to an external device, such as a personal computer or a network via the input/output device 630, and may be configured to exchange data with the external device.

The memory device 620 may store codes or programs for operations of the processor 610. For example, the memory 620 may include at least one of the non-volatile memory elements and/or devices described above with regard to FIGS. 1-2B and 4-10.

For example, such an electronic system 600 may embody various electronic control systems requiring the memory 620, and, for example, may be used in mobile phones, MP3 players, navigation devices, solid state disks (SSD), or household appliances.

While example embodiments have been particularly shown and described with reference to the drawings and using specific terms, example embodiments and terms have been used to explain the present disclosure and should not be construed as limiting the scope defined by the claims. For example, at least one material layer may be additionally included in the memory elements shown in FIGS. 1, 8, and 9. The memory elements shown in FIGS. 1, 8, and 9 may be used not only in the cross-point memory device of FIG. 10, but also in other various memory devices. Therefore, the scope is defined not by the detailed description of example embodiments, but by the appended claims, and all differences within the scope will be construed as being included in this disclosure.

What is claimed is:

1. A non-volatile memory element comprising:
a memory layer disposed between a first electrode and a second electrode, the memory layer including a first material layer and a second material layer configured to exchange ionic species to change a resistance state of the memory layer; and a buffer layer disposed between the memory layer and the first electrode; wherein
the first material layer is an oxygen supplying layer and the second material layer is an oxygen exchanging layer,
an oxygen concentration of the oxygen exchanging layer increases one of gradually and in stages in a direction from the oxygen supplying layer to the second electrode,
the oxygen exchanging layer includes a first region having a first oxygen concentration and a second region having a second oxygen concentration, the second oxygen concentration being greater than the first oxygen concentration,
the first region is in direct contact with the oxygen supplying layer, and
the second region is in direct contact with the second electrode.

2. The non-volatile memory element of claim 1, wherein the oxygen supplying layer is formed of a first metal oxide.

3. The non-volatile memory element of claim 2, wherein the first metal oxide includes at least one of Ta oxide, Ti oxide, Zr oxide, yttria-stabilized zirconia (YSZ), Hf oxide, Mn oxide, Mg oxide, and a combination thereof.

4. The non-volatile memory element of claim 3, wherein the first metal oxide includes $TaO_x$, wherein $0<x<2.5$.

5. The non-volatile memory element of claim 2, wherein the oxygen exchanging layer is formed of a second metal oxide.

6. The non-volatile memory device of claim 5, wherein the second metal oxide is formed of an oxide from the same group as the first metal oxide or a different group from the first metal oxide.

7. The non-volatile memory element of claim 6, wherein the second metal oxide includes at least one of Ta oxide, Ti oxide, Zr oxide, yttria-stabilized zirconia (YSZ), Hf oxide, Mn oxide, Mg oxide, and a combination thereof.

8. The non-volatile memory element of claim 1, wherein the oxygen concentration of the oxygen exchanging layer is greater than an oxygen concentration of the oxygen supplying layer.

9. The non-volatile memory element of claim 1, wherein an oxygen mobility of the oxygen exchanging layer is greater than or equal to an oxygen mobility of the oxygen supplying layer.

10. The non-volatile memory element of claim 1, wherein the oxygen concentration of the oxygen exchanging layer varies gradually in the direction in which the oxygen exchanging layer is deposited.

11. The non-volatile memory element of claim 1, wherein the oxygen concentration of the oxygen exchanging layer varies in stages in the direction in which the oxygen exchanging layer is deposited.

12. The non-volatile memory element of claim 1, wherein the first region of the oxygen exchanging layer is disposed on the oxygen supplying layer and the second region of the oxygen exchanging layer is disposed between the first region and the second electrode.

13. The non-volatile memory element of claim 1, wherein the buffer layer includes a material that increases a potential barrier between the first electrode and the memory layer.

14. The non-volatile memory element of claim 1, wherein the buffer layer includes a material having an interatomic bonding energy greater than an interatomic bonding energy of the memory layer.

15. The non-volatile memory element of claim 1, wherein the buffer layer includes at least one of $AlO_x$, $SiO_x$, $SiN_x$, $ZrO_x$, $HfO_x$, and a combination thereof.

16. The non-volatile memory element of claim 1, wherein the first electrode is formed of one of a base metal and a conductive oxide.

17. The non-volatile memory element of claim 1, wherein the first electrode includes at least one of W, Ni, Al, Ti, Ta, TiN, TiW, TaN, IZO, ITO, $IrO_2$, Ir, Ru, Pd, Au, and Pt.

18. The non-volatile memory element of claim 1, wherein the second electrode includes at least one of $IrO_2$, Ir, Ru, Pd, Au, and Pt.

19. The non-volatile memory element of claim 18, wherein the second electrode is formed of $IrO_2$ or Ir.

20. A memory device comprising: the non-volatile memory element of claim 1.

21. The memory device of claim 20, further comprising:
a switching element connected to the non-volatile memory element.

22. A memory device comprising:
a plurality of first wirings arranged in parallel with one another;
a plurality of second wirings crossing the first wirings and arranged in parallel with one another; and
a first memory cell formed at each cross-point between the plurality of first wirings and the plurality of second wirings, each first memory cell including,
a memory layer disposed between the first wiring and the second wiring, and including a first material layer and a second material layer configured to exchange ionic species to change a resistance state of the memory layer, and
a buffer layer disposed between the memory layer and the first wiring; wherein
the first material layer is an oxygen supplying layer and the second material layer is an oxygen exchanging layer,
an oxygen concentration of the oxygen exchanging layer increases one of gradually and in stages in a direction from the oxygen supplying layer to the second wiring,
the oxygen exchanging layer includes a first region having a first oxygen concentration and a second region having a second oxygen concentration, the second oxygen concentration being greater than the first oxygen concentration,
the first region is in direct contact with the oxygen supplying layer, and
the second region is in direct contact with an intermediate electrode disposed between the first wiring and the second wiring.

23. The memory device of claim 22, wherein each first memory cell further comprises a switching element disposed between the memory layer and the second wiring, and wherein the intermediate electrode is disposed between the memory layer and the switching element.

24. The memory device of claim 22, wherein the oxygen supplying layer is formed of a first metal oxide and the oxygen exchanging layer is formed of a second metal oxide, the second metal oxide being formed of an oxide from a same group as the first metal oxide.

25. The memory device of claim 22, wherein the oxygen supplying layer is formed of a first metal oxide, and the oxygen exchanging layer is formed of a second metal oxide, the second metal oxide being an oxide of a different group from the first metal oxide.

26. The memory device of claim 22, wherein the oxygen supplying layer is formed of a first metal oxide including at least one of Ta oxide, Ti oxide, Zr oxide, yttria-stabilized zirconia (YSZ), Hf oxide, Mn oxide, Mg oxide, and a combination thereof.

27. The memory device of claim 26, wherein the first metal oxide includes $TaO_x$, wherein $0<x<2.5$.

28. The memory device of claim 22, wherein the oxygen exchanging layer is formed of a second metal oxide including at least one of Ta oxide, Ti oxide, Zr oxide, yttria-stabilized zirconia (YSZ), Hf oxide, Mn oxide, Mg oxide, and a combination thereof.

29. The memory device of claim 22, wherein an oxygen concentration of the oxygen exchanging layer varies in a direction in which the oxygen exchanging layer is deposited.

30. The memory device of claim 29, wherein the oxygen concentration of the oxygen exchanging layer varies one of gradually and in stages in the direction in which the oxygen exchanging layer is deposited.

31. The memory device of claim 22, wherein the buffer layer includes at least one of $AlO_x$, $SiO_x$, $SiN_x$, $ZrO_x$, $HfO_x$, and a combination thereof.

32. The memory device of claim 22, wherein the first wiring includes at least one of W, Ni, Al, Ti, Ta, TiN, TiW, TaN, IZO, ITO, $IrO_2$, Ir, Ru, Pd, Au, and Pt.

33. The memory device of claim 22, wherein an electrode contacts the memory layer, and the electrode includes at least one of $IrO_2$, Ir, Ru, Pd, Au, and Pt.

34. The memory device of claim 22, further comprising:
a plurality of third wirings arranged to cross the plurality of second wirings; and
a second memory cell formed at each cross-point between the plurality of second wirings and the plurality of third wirings.

35. The memory device of claim 34, wherein the second memory cell has a different structure than the first memory cell.

36. The memory device of claim 34, wherein the second memory cell has a same structure as the first memory cell.

* * * * *